US009264061B2

(12) United States Patent
Kim

(10) Patent No.: US 9,264,061 B2
(45) Date of Patent: Feb. 16, 2016

(54) APPARATUS AND METHOD FOR GENERATING SINUSOIDAL WAVES, AND SYSTEM FOR DRIVING PIEZOELECTRIC ACTUATOR USING THE SAME

(71) Applicant: SAMSUNG ELECTRO-MECHANICS CO., LTD., Suwon-Si, Gyeonggi-Do (KR)

(72) Inventor: Gyu Won Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 27 days.

(21) Appl. No.: 14/245,670

(22) Filed: Apr. 4, 2014

(65) Prior Publication Data

US 2015/0171792 A1 Jun. 18, 2015

(30) Foreign Application Priority Data

Dec. 18, 2013 (KR) .................. 10-2013-0158081

(51) Int. Cl.
*H03B 28/00* (2006.01)
*H03M 1/66* (2006.01)
*H02N 2/00* (2006.01)
*G06F 1/02* (2006.01)
*G06F 1/03* (2006.01)

(52) U.S. Cl.
CPC ................ *H03M 1/66* (2013.01); *G06F 1/022* (2013.01); *G06F 1/0321* (2013.01); *H02N 2/008* (2013.01)

(58) Field of Classification Search
CPC ......... H02N 2/008; H03M 1/66; G06F 1/022; G06F 1/03; G06F 1/0321
USPC .......................................... 327/105, 106, 129
See application file for complete search history.

(56) References Cited

U.S. PATENT DOCUMENTS

| 4,905,101 | A | 2/1990 | Ohta et al. |
| 6,098,465 | A * | 8/2000 | Matsumoto et al. ............ 73/808 |
| 6,407,480 | B1 | 6/2002 | Nakanishi et al. |
| 2004/0264547 | A1 | 12/2004 | Robinson et al. |

(Continued)

FOREIGN PATENT DOCUMENTS

| JP | 2003-229723 A | 8/2003 |
| JP | 2005-20695 A | 1/2005 |
| JP | 5070571 B2 | 11/2012 |
| JP | 2013-157824 A | 8/2013 |
| KR | 1992-0001003 B1 | 4/1989 |
| KR | 2001-0033383 A | 4/2001 |

OTHER PUBLICATIONS

Office Action Issued on Jul. 31, 2015 in the corresponding Korean Patent Application No. 10-2013-0158081, 6 pages in English, 5 pages in Korean.

*Primary Examiner* — William Hernandez
(74) *Attorney, Agent, or Firm* — NSIP Law

(57) ABSTRACT

An apparatus for generating sinusoidal waves may includes a look-up table storage unit including a plurality of sampling points with respect to a base frequency, a waveform-synthesizing unit calculating an integer ratio between an input target frequency and the base frequency and loading at least some of the plurality of sampling points from the look-up table storage unit according to the integer ratio, a correction unit substituting a digital value of at least one sampling point among the sampling points loaded from the look-up table with a digital value of a sampling point among the plurality of sampling points included in the look-up table storage unit having a maximum value, and a sinusoidal generation unit generating sinusoidal waves using the sampling points changed by the correction unit.

18 Claims, 7 Drawing Sheets

(56) References Cited

U.S. PATENT DOCUMENTS

| | | | |
|---|---|---|---|
| 2009/0243431 A1* | 10/2009 | Ohsawa | 310/317 |
| 2010/0060495 A1 | 3/2010 | Asami et al. | |
| 2011/0254671 A1* | 10/2011 | Okimoto et al. | 340/407.1 |
| 2013/0194007 A1 | 8/2013 | Nakamura | |
| 2015/0162519 A1* | 6/2015 | Kim et al. | 318/116 |
| 2015/0168989 A1* | 6/2015 | Kim | 318/116 |
| 2015/0168990 A1* | 6/2015 | Park et al. | 318/116 |

\* cited by examiner

APPARATUS AND METHOD FOR GENERATING SINUSOIDAL WAVES, AND SYSTEM FOR DRIVING PIEZOELECTRIC ACTUATOR USING THE SAME

CROSS-REFERENCE TO RELATED APPLICATION

This application claims the benefit of Korean Patent Application No. 10-2013-0158081, filed on Dec. 18, 2013, with the Korean Intellectual Property Office, the disclosure of which is incorporated herein by reference.

BACKGROUND

The present disclosure relates to an apparatus and a method for generating sinusoidal waves, and a system for driving a piezoelectric actuator using the same.

As interest in user interfaces is on the rise and related technologies advance, it is essential for user interfaces to be provided with technology for providing responses to user input in various terminals.

At the early stages thereof, response technology was provided to allow users to intuitively confirm that user input had been received by simply providing vibrations.

Recently, it has become essential to provide precise responses or vibrations in response to user input, and accordingly, providing vibrations with greater precise has become an important issue. Therefore, touch response technology has advanced from conventional motor-driven technology to haptic technology, able to provide various types of response to users.

Haptic technology refers to an overall system for providing tactile feedback to users, and such feedback may be provided to users by vibrating a vibration element to deliver physical impulses. In the early stages thereof, the haptic technology merely provided simple confirmation of user input. Recently, however, haptic technology has been required to provide various types of response to emotional feedback, based greater precision in the controlling thereof.

To this end, it is required to provide three-dimensional vibration patterns using various frequency bands, and in order to meet this requirement, a piezoelectric actuator formed of ceramic material has recently been employed. Such piezoelectric actuators have advantages over existing linear resonant actuators or vibration motors with magnets in that they have faster response speeds, generate less noise, and have higher resonant bandwidths. Accordingly, minute and three-dimensional vibrations can be variously realized.

Since such a piezoelectric actuator uses sinusoidal waves for its driving signal, it is essential for more precise control to generate sinusoidal waves more precisely with no distortion. In other words, because the piezoelectric element is driven with sinusoidal waves, it is necessary to obtain wave accuracy of sinusoidal waves generated from a piezo driving device in order to accurately drive the piezoelectric element.

According to the technology for driving a piezoelectric actuator in the related art, in order to precisely generate sinusoidal waves, a look-up table having high-resolution digital values stored therein and a high-resolution digital-to-analog converter are used. Since the digital values stored in the look-up table are determined based on a base frequency and a sampling frequency, when a target frequency a user desires is greatly increased, the peak value of sinusoidal waves deviates from the target value.

SUMMARY

An exemplary embodiment in the present disclosure may provide an apparatus and a method for generating sinusoidal waves capable of generating sinusoidal waves precisely by way of determining whether sampling points determined based on a base frequency and a target frequency correspond to sampling points corresponding to the maximum and minimum levels of the sinusoidal waves, and a system for driving a piezoelectric actuator using the same.

According to an exemplary embodiment in the present disclosure, an apparatus for generating sinusoidal waves may include: a look-up table storage unit including a plurality of sampling points with respect to a base frequency; a waveform-synthesizing unit calculating an integer ratio between an input target frequency and the base frequency and loading at least some of the plurality of sampling points from the look-up table storage unit according to the integer ratio; a correction unit substituting a digital value of at least one sampling point among the sampling points loaded from the look-up table storage unit with a digital value of a sampling point among the plurality of sampling points included in the look-up table storage unit having a maximum value; and a sinusoidal generation unit generating sinusoidal waves using the sampling points changed by the correction unit.

The waveform-synthesizing unit may calculate the integer ratio by dividing the target frequency by the base frequency.

The waveform-synthesizing unit may load every $n^{th}$ sampling point from among the plurality of sampling points in the look-up table storage unit, where n denotes the integer ratio.

The correction unit may substitute a digital value of a sampling point having a maximum value among the loaded sampling points with a digital value of a sampling point included in the look-up table storage unit having a maximum value if a sampling point having a maximum value is not loaded by the waveform-synthesizing unit from among the sampling points included in the look-up table storage unit.

The correction unit may substitute a digital value of a sampling point having a maximum value among the loaded sampling points and a digital value of a sampling point having a second maximum value with a digital value of a sampling point among the plurality of sampling points included in the look-up table storage unit having a maximum value if the target frequency is greater than a predetermined limiting frequency.

The correction unit may substitute a digital value of at least one sampling point among the loaded sampling points with a digital value of a sampling point among the plurality of sampling points included in the look-up table storage unit having a minimum value.

The correction unit may substitute a digital value of a sampling point having a minimum value among the loaded sampling points with a digital value of a sampling point included in the look-up table storage unit having a minimum value if a sampling point having a minimum value is not loaded by the waveform-synthesizing unit from among the sampling points included in the look-up table storage unit.

The correction unit may substitute a digital value of a sampling point having a minimum value among the loaded sampling points and a digital value of a sampling point having a second minimum value with a digital value of a sampling point among the plurality of sampling points included in the look-up table storage unit having a minimum value if the target frequency is greater than a predetermined limiting frequency.

The correction unit may include: a frequency comparator comparing the target frequency with a predetermined limiting frequency; and a sampling point corrector substituting a digital value of at least one sampling point among the loaded sampling points according to a result obtained by comparing the target frequency with the limiting frequency.

The sampling point corrector may substitute a digital value of a sampling point having a maximum value and a digital value of a sampling point having a second maximum value among the loaded sampling points, with a digital value of a sampling point among the plurality of sampling points included in the look-up table storage unit having a maximum value if the target frequency is greater than the limiting frequency.

The sinusoidal wave generating unit may include a digital-to-analog converter converting digital values of a plurality of sampling points changed by the correction unit into analog values; and an amplifier filtering the analog values.

The digital-to-analog converter may be a binary digital-to-analog converter.

According to an exemplary embodiment in the present disclosure, a method for generating sinusoidal waves may include receiving a target frequency; loading at least some of a plurality of sampling points included in a look-up table by using an integer ratio calculated based on the target frequency and a predetermined base frequency; correcting a digital value of at least one sampling point among the loaded sampling points with a digital value of a sampling point having a maximum value among a plurality of sampling points included in the look-up table; and generating sinusoidal waves according to the changed sampling points.

The loading of the plurality of sampling points may include loading every $n^{th}$ sampling point from among the sampling points in the look-up table, where n denotes the integer ratio.

The method may further include: correcting a digital value of at least one sampling point among the loaded sampling points with a digital value of a sampling point having a minimum value among the sampling points included in the look-up table, prior to the generating of the sinusoidal waves.

The correcting of the sampling point may include: comparing the target frequency with a predetermined limiting frequency; and correcting a digital value of a sampling point having a maximum value and a digital value of a sampling point having a second maximum value among the loaded sampling points, with a digital value of a sampling point having a maximum value among the plurality of sampling points included in the look-up table if the target frequency is greater than the limiting frequency.

The correcting of the sampling point may further include: correcting a digital value of a sampling point among the loaded sampling points having a minimum value and a digital value of a sampling point having a second minimum value, with a digital value of a sampling point having a minimum value among the plurality of sampling points included in the look-up table.

According to an exemplary embodiment in the present disclosure, a system for driving a piezoelectric actuator may include: a piezoelectric actuator operated by receiving sinusoidal waves at both terminals thereof; and the apparatus for generating sinusoidal waves as described above.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

Figure 1:
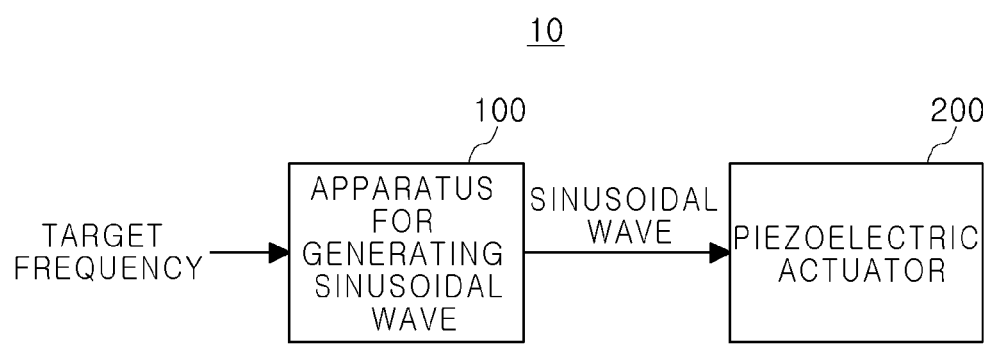
FIG. 1 is a block diagram of a system for driving a piezoelectric actuator according to an exemplary embodiment of the present disclosure.

FIG. 1 is a block diagram of a system for driving a piezoelectric actuator according to an exemplary embodiment of the present disclosure.

Referring to FIG. 1, the system 10 for driving a piezoelectric actuator may include an apparatus for generating sinusoidal waves 100 and a piezoelectric actuator 200.

The apparatus for generating sinusoidal waves 100 may generate sinusoidal waves to drive the piezoelectric actuator 200 and may provide it to the piezoelectric actuator 200. Accordingly, the apparatus for generating sinusoidal waves 100 may serve as an apparatus for driving the piezoelectric actuator 200.

Upon receiving a target frequency for sinusoidal waves to be generated, the apparatus for generating sinusoidal waves 100 may generate sinusoidal waves at the target frequency.

The apparatus for generating sinusoidal waves 100 may generate sinusoidal waves using a look-up table. The look-up table may include a plurality of sampling points determined based on a base frequency and a predetermined sampling frequency.

For example, if the base frequency is 7.8125 Hz and the predetermined sampling frequency is 8 KHz, there may be 1,024 sampling points. In this example, if the target frequency is 8 KHz, values corresponding to 1,024 sampling points are loaded, and analog values (e.g., current) corresponding to the values are output, thereby generating sinusoidal waves.

That is, the apparatus for generating sinusoidal waves 100 may load the sampling points using the look-up table having digital values stored therein, and then perform digital-analog conversion to thereby generate sinusoidal waves.

The apparatus for generating sinusoidal waves 100 may determine whether the sampling points selected based on the magnitude of the target frequency and the target frequency correspond to sampling points corresponding to predetermined maximum and minimum levels of the sinusoidal waves and, if not, may change the sampling points selected based on the target frequency so as to generate sinusoidal waves.

The piezoelectric actuator 200 may be operated by receiving at both terminals thereof the sinusoidal waves from the apparatus for generating sinusoidal waves 100.

Figure 2:
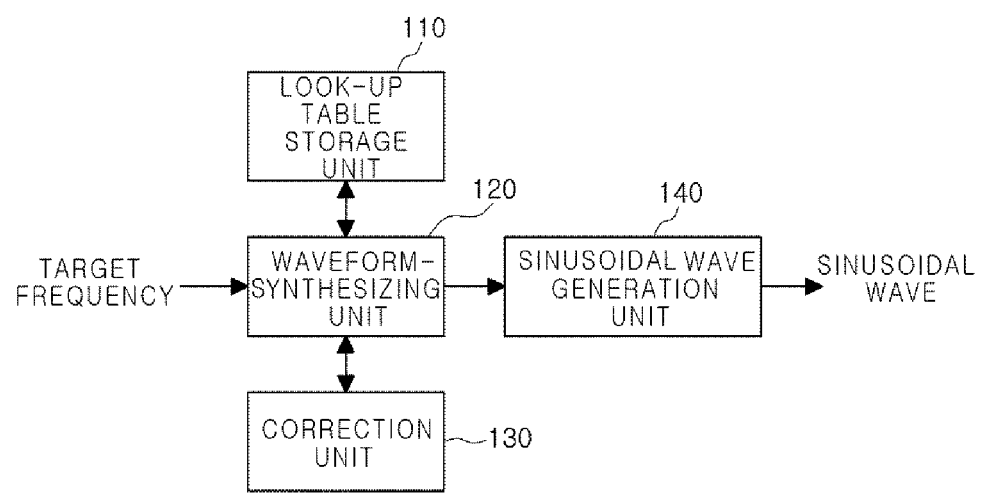
FIG. 2 is a block diagram of an example of the apparatus for generating sinusoidal waves shown in FIG. 1.
Figure 3:
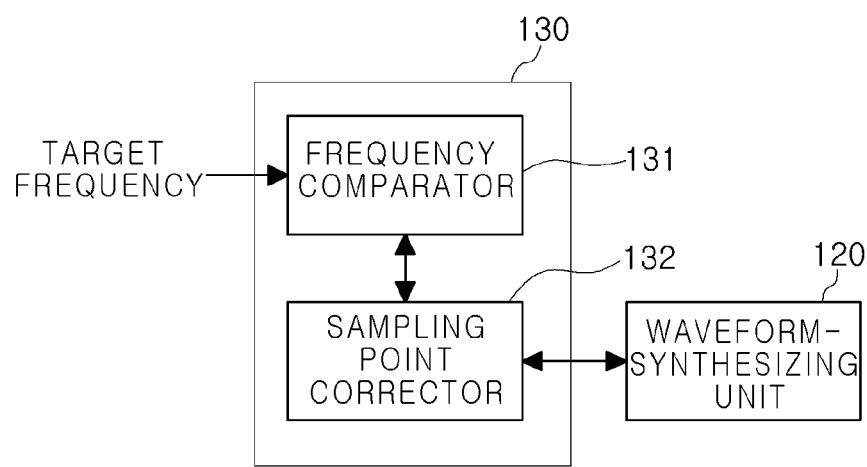
FIG. 3 is a block diagram of an example of the correction unit shown in FIG. 2.

FIG. 2 is a block diagram of an example of the apparatus for generating sinusoidal waves shown in FIG. 1, and FIG. 3 is a block diagram of an example of the correction unit shown in FIG. 2.

Referring to FIG. 2, the apparatus for generating sinusoidal waves 100 may include a look-up table storage unit 110, a waveform-synthesizing unit 120, a correction unit 130, and sinusoidal wave generating unit 140.

The look-up table storage unit 110 may store a look-up table that includes a plurality of sampling points determined based on a base frequency and a sampling frequency.

One period of sinusoidal waves may be generated based on all of the sampling points stored in the look-up table storage unit 110. Due to the nature of the sinusoidal waves, if the sampling frequency is higher, there may be multiple sampling points corresponding to the maximum level and multiple sampling points corresponding to the minimum level of the sinusoidal waves.

In the following description, for convenience of illustration, sinusoidal waves generated based on all of the sampling points stored in the look-up table storage unit 110 is referred to as a predetermined sinusoidal wave.

The waveform-synthesizing unit 120 may calculate the integer ratio of the target frequency to the base frequency, and may select and load sampling points from the look-up table stored in the look-up table storage unit 110 by reflecting the integer ratio.

Specifically, assuming that the integer ratio is n, the waveform-synthesizing unit 120 may select and load every $n^{th}$ sampling point from among the sampling points.

In an exemplary embodiment, sampling points selected and loaded by the waveform-synthesizing unit 120 at first may be sampling points stored at first in the look-up table storage unit 110 among the plurality of sampling points stored in the look-up table storage unit 110.

For example, assuming that the base frequency is 7.8125 Hz, the predetermined sampling frequency is 8 KHz, and the target frequency is 23.4375 KHz, there are 1,024 ((=8000/7.8125) sampling points, and the integer ratio n is 3 (=23.4375/7.8125).

Accordingly, the waveform-synthesizing unit 120 may select and load every third sampling point, e.g., 1st, 4th, 7th sampling point, and so on from among the 1,024 sampling points.

The correction unit 130 may change the sampling points according to the magnitude of an input target frequency and digital values of sampling points provided from the waveform-synthesizing unit 120.

The correction unit 130 may substitute a digital value of at least one of the sampling points loaded from the look-up table storage unit 110 with a digital value of a sampling point having the maximum value among the sampling points in the look-up table storage unit 110.

In an exemplary embodiment, if a sampling point having the maximum value is not loaded by the wave-synthesizing unit 120 from the sampling points included in the look-up table storage unit 110, the correction unit 130 may substitute a digital value of a sampling point having the maximum value among the loaded sampling point with a digital value of a sampling point having the maximum value included in the look-up table storage unit 110.

Similarly, the correction unit 130 may substitute a digital value of at least one of the loaded sampling points with a digital value of a sampling point having the minimum value among the sampling points in the look-up table storage unit 110.

In an exemplary embodiment, if a sampling point having the minimum value is not loaded by the wave-synthesizing unit 120 from the sampling points included in the look-up table storage unit 110, the correction unit 130 may substitute a digital value of a sampling point having the maximum value among the loaded sampling point with a digital value of a sampling point having the minimum value included in the look-up table storage unit 110.

In this connection, the correction unit 130 may differently correct the sampling points depending on a result obtained by comparing the magnitude of a target frequency with a predetermined limiting frequency.

If the magnitude of the target frequency is less than the limiting frequency, the number of the loaded sampling points is sufficient for generating sinusoidal waves. Accordingly, in order to maintain the amplitude of sinusoidal waves generated by the sinusoidal wave generating unit 140, the correction unit 130 may correct a plurality of sampling points loaded by the waveform-synthesizing unit 120 so that they have the maximum and minimum values.

Specifically, if the magnitude of the target frequency is less than the limiting frequency, the control unit 130 may substitute a digital value of a sampling point having the maximum value and a digital value of a sampling point having the minimum value among the sampling points loaded by the waveform-synthesizing unit 120, with a digital value of a sampling point having the maximum value and a digital value of a sampling point having the minimum value among the sampling points in the look-up table storage unit 110, respectively.

On the other hand, if the magnitude of the target frequency is greater than the limiting frequency, the number of the loaded sampling points is insufficient for generating sinusoidal waves, so that the sinusoidal waves to be generated by the sinusoidal wave generating unit 140 may be very close to a triangular wave. When this happens, the correction unit 130 may change both a digital value of a sampling point having the maximum value and a digital value of a sampling point having the second maximum value among the sampling points loaded by the waveform-synthesizing unit 120, with a digital value of a sampling point having the maximum value among the sampling points in the look-up table storage unit 110.

Further, the correction unit 130 may change both a digital value of a sampling point having the minimum value and a digital value of a sampling point having the second minimum value among the sampling points loaded by the waveform-synthesizing unit 120, with a digital value of a sampling point having the minimum value among the sampling points in the look-up table storage unit 110.

More specifically, if the magnitude of the target frequency is less than the magnitude of the limiting frequency, and if a digital value of a sampling point having the maximum value among the sampling points loaded by the waveform-synthesizing unit 120 is equal to a digital value of a sampling point having the maximum value among the sampling points in the look-up table storage unit 110, the correction unit 130 may not change the digital value of the sampling point having the maximum value but may substitute a digital value of a sampling point having the second maximum value with a digital value of a sampling point having the maximum value among the sampling points in the look-up table storage unit 110.

Similarly, if a digital value of a sampling point having the minimum value among the sampling points loaded by the waveform-synthesizing unit 120 is equal to a digital value of a sampling point having the minimum value among the sampling points in the look-up table storage unit 110, the correction unit 130 may not change the digital value of the sampling point having the minimum value but may substitute a digital value of a sampling point having the second minimum value with a digital value of a sampling point having the minimum value among the sampling points in the look-up table storage unit 110.

In an exemplary embodiment, the correction unit 130 may include a frequency comparator 131 and a sampling point corrector 132, as shown in FIG. 3.

The frequency comparator 131 may receive the target frequency and compare it with a predetermined limiting frequency.

The sampling point corrector 132 may change a digital value of at least one sampling point among the loaded sampling points based on a result obtained by comparing the target frequency with the limiting frequency.

Specifically, if the magnitude of the target frequency is less than the limiting frequency, the sampling point corrector 132 may substitute a digital value of a sampling point having the maximum value and a digital value of a sampling point having the minimum value among the sampling points loaded by the waveform-synthesizing unit 120, with a digital value of a sampling point having the maximum value and a digital value of a sampling point having the minimum value among the sampling points in the look-up table storage unit 110, respectively.

Further, if the magnitude of the target frequency is greater than the limiting frequency, the correction unit 132 may change both a digital value of a sampling point having the maximum value and a digital value of a sampling point having the second maximum value among the sampling points loaded by the waveform-synthesizing unit 120, with a digital value of a sampling point having the maximum value among the sampling points in the look-up table storage unit 110.

Figure 4:
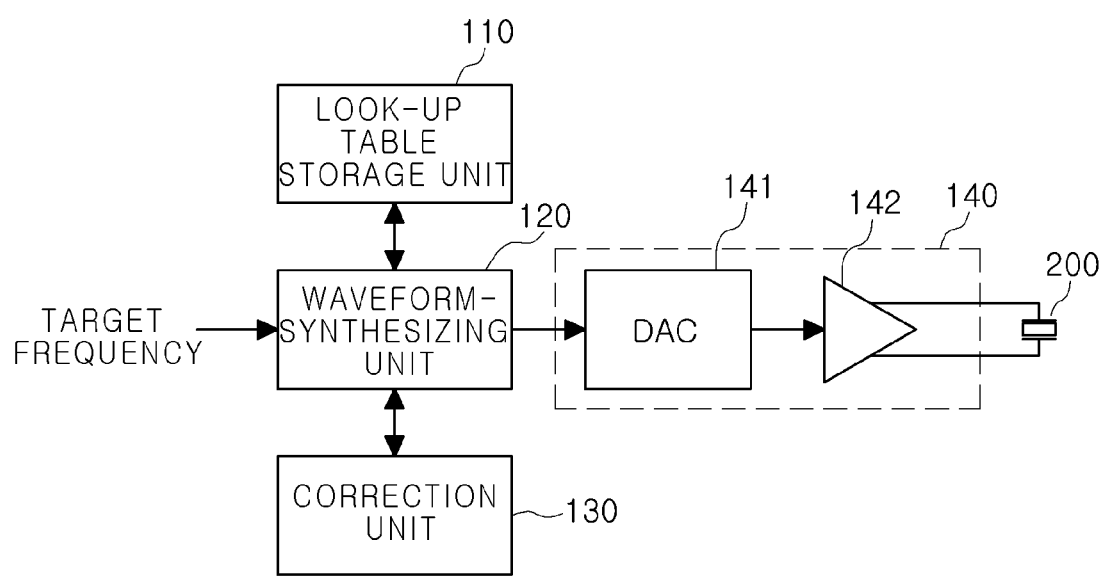
FIG. 4 is a block diagram of an example of the sinusoidal wave generating unit shown in FIG. 2.

FIG. 4 is a block diagram of an example of the sinusoidal wave generating unit shown in FIG. 2.

Referring to FIG. 4, the sinusoidal wave generating unit 140 may include a digital-to-analog converter 141 and an amplifier 142.

The digital-to-analog converter 141 may receive digital values of the sampling points loaded by the waveform-synthesizing unit 130 and may convert them into analog values to output them.

Upon receiving a target frequency, the digital-to-analog converter 141 may select sampling points based on a base frequency so as to output analog values corresponding to the sampling points corresponding to the target frequency.

In an exemplary embodiment, the digital-to-analog converter 141 may be a binary digital-to-analog converter.

The amplifier 142 may filter the analog values output from the digital-to-analog converter 141 to generate sinusoidal waves and may provide it to the piezoelectric actuator 200.

Figure 5:
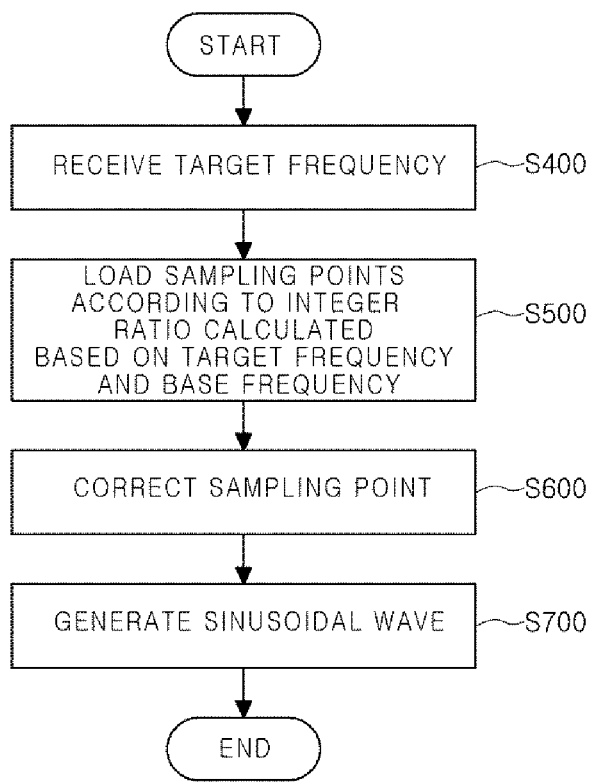
FIG. 5 is a flowchart for illustrating a method for generating sinusoidal waves according to an exemplary embodiment of the present disclosure.
Figure 6:
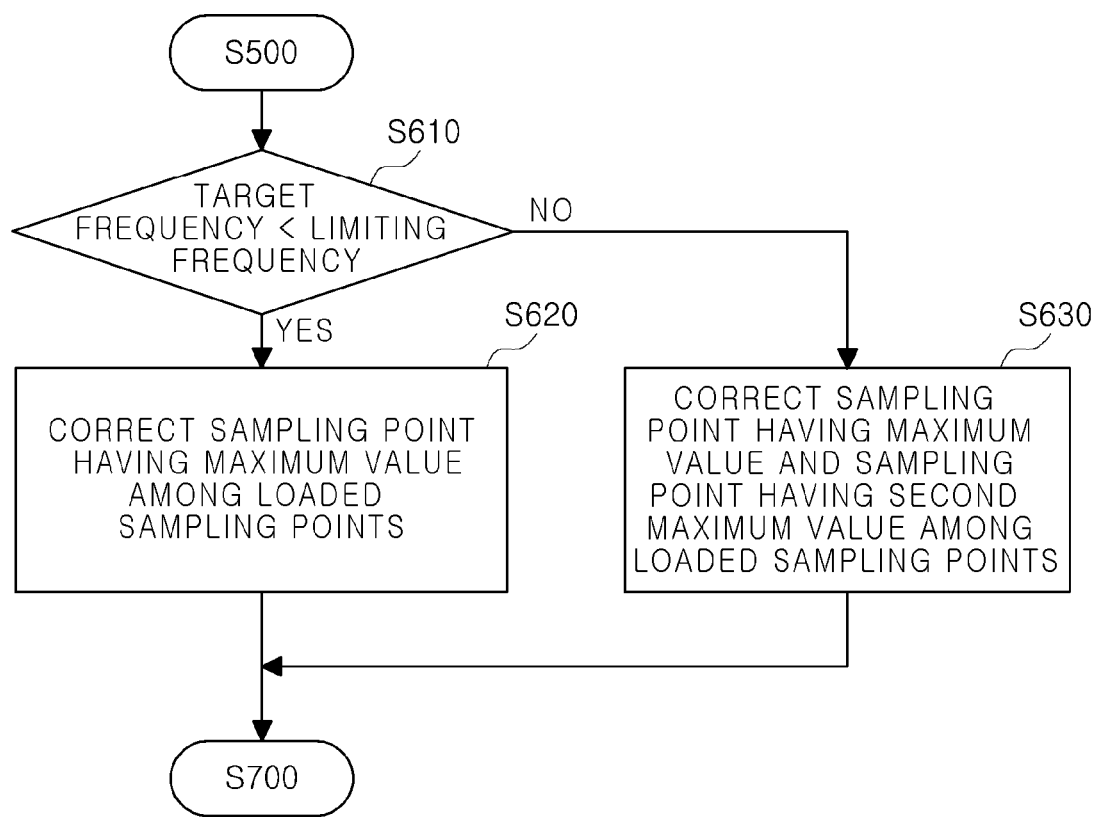
FIG. 6 is a flowchart for illustrating an example of the changing of sampling points illustrated in FIG. 5.
Figure 7:
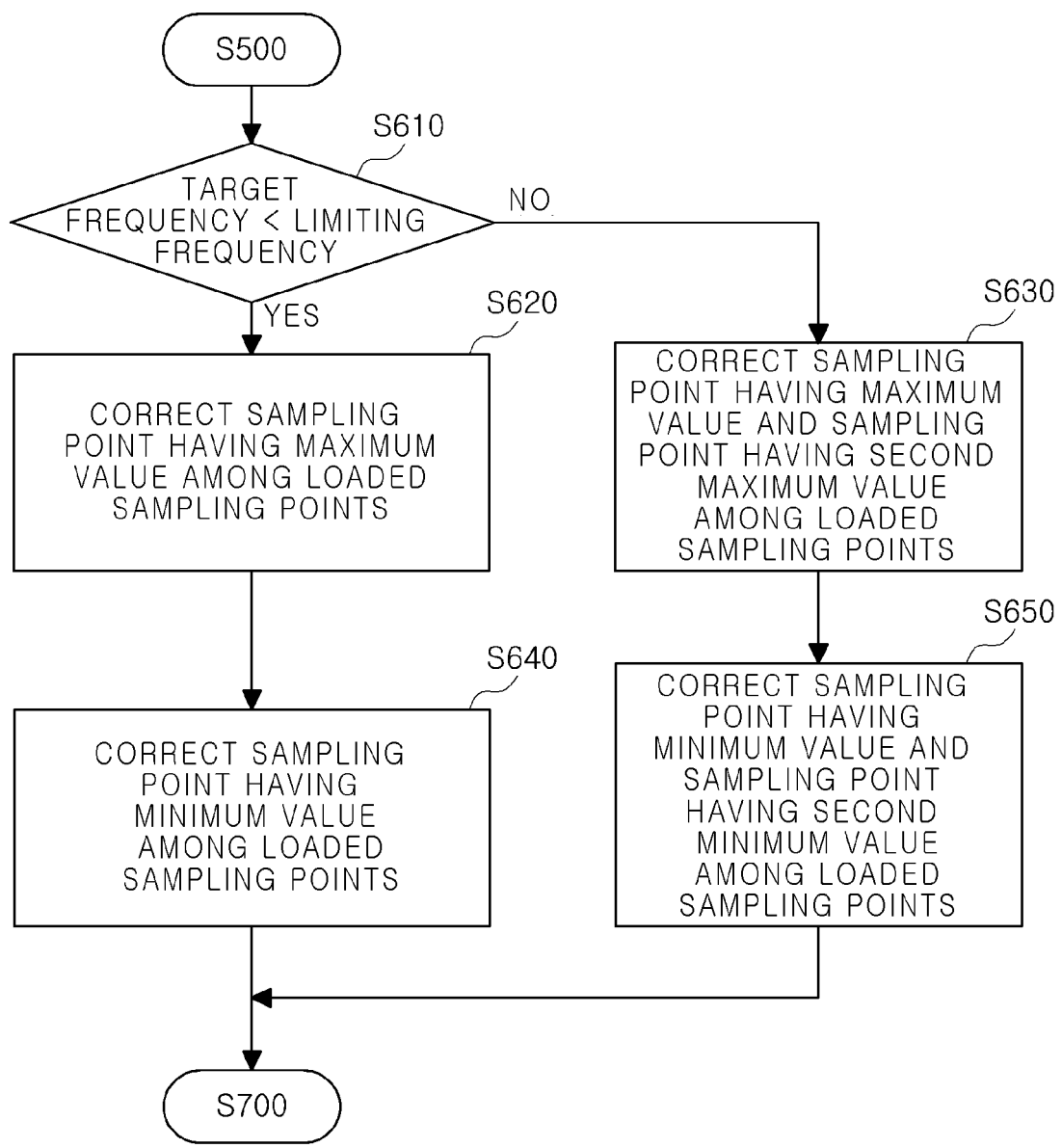
FIG. 7 is a flowchart for illustrating another example of the changing of sampling points illustrated in FIG. 5.

FIG. 5 is a flowchart for illustrating a method for generating sinusoidal waves according to an exemplary embodiment of the present disclosure, FIG. 6 is a flowchart for illustrating an example of the changing of sampling points illustrated in FIG. 5, and FIG. 7 is a flowchart for illustrating another example of the changing of sampling points illustrated in FIG. 5.

The method for generating sinusoidal waves according to the exemplary embodiment shown in FIGS. 5 through 7 is performed by the apparatus for generating sinusoidal waves 100 described above with reference to FIGS. 1 through 4, and thus redundant descriptions will not be made.

Referring to FIGS. 5 through 7, the method for generating sinusoidal waves according to the exemplary embodiment starts with receiving, by the waveform-synthesizing unit 120, a target frequency (S400). Then, the waveform-synthesizing unit 120 may load some sampling points stored in the look-up table storage unit according to an integer ratio calculated based on the target frequency and a base frequency (S500). The correction unit 130 may correct digital values of at least one sampling point among the loaded sampling points by a digital value of a sampling point having the maximum value among the sampling points included in the look-up table (S600).

If the sampling point is corrected by the correction unit 130, the sinusoidal wave generating unit 140 may generate sinusoidal waves according to the corrected sampling points (S700).

In an exemplary embodiment, the method for generating sinusoidal waves may further include correcting a digital value of at least one sampling point among the loaded sampling points by a digital value of a sampling point having the minimum value among the sampling points included in the look-up table (S640), prior to the generating of the sinusoidal waves S700.

In an example of the correcting of the sampling points S600, the correction unit 130 may compare the target frequency with a predetermined limiting frequency (S610) and, if the target frequency is less than the limiting frequency as the comparison result, may correct a digital value of a sampling point having the maximum value among the loaded sampling points as a sampling point having the maximum value among the sampling points included in the look-up table (S620).

Then, the correction unit 130 may correct a digital value of a sampling point having the minimum value among the loaded sampling points by a digital value of a sampling point having the minimum value among the sampling points included in the look-up table (S640).

Alternatively, if the target frequency is greater than the limiting frequency as a result of the comparison, a digital value of a sampling point having the maximum value and a digital value of a sampling point have the second maximum value among the loaded sampling points may be corrected by a digital value of a sampling point having the maximum value among the sampling points included in the look-up table (S630).

Then, the correction unit 130 may correct a digital value of a sampling point having the minimum value and a digital value of a sampling point having the second minimum value among the loaded sampling points by a digital value of a sampling point having the minimum value among the sampling points included in the look-up table (S650).

As set forth above, according to exemplary embodiments of the present disclosure, sinusoidal waves can be generated precisely by way of determining whether sampling points determined based on a base frequency and a target frequency correspond to sampling points corresponding to the maximum and minimum levels of the sinusoidal waves.

While exemplary embodiments have been shown and described above, it will be apparent to those skilled in the art that modifications and variations could be made without departing from the spirit and scope of the present disclosure as defined by the appended claims.

What is claimed is:

1. An apparatus for generating sinusoidal waves, comprising:
   a look-up table storage unit configured to include a plurality of sampling points with respect to abase frequency;
   a waveform-synthesizing unit configured to calculate an integer ratio between an input target frequency and the base frequency and loading at least some of the plurality of sampling points from the look-up table storage unit according to the integer ratio;
   a correction unit configured to substitute a digital value of at least one sampling point among the sampling points loaded from the look-up table with a digital value of a sampling point among the plurality of sampling points included in the look-up table storage unit having a maximum value; and a sinusoidal wave generation unit configured to generate sinusoidal waves using the sampling points changed by the correction unit.

2. The apparatus of claim 1, wherein the waveform-synthesizing unit calculates the integer ratio by dividing the target frequency by the base frequency.

3. The apparatus of claim 2, wherein the waveform-synthesizing unit loads every $n^{th}$ sampling point from among the plurality of sampling points in the look-up table storage unit, where n denotes the integer ratio.

4. The apparatus of claim 1, wherein the correction unit changes a digital value of a sampling point having a maximum value among the loaded sampling points with a digital value of a sampling point included in the look-up table storage unit having a maximum value if a sampling point having a maximum value is not loaded by the waveform-synthesizing unit from among the sampling points included in the look-up table storage unit.

5. The apparatus of claim 1, wherein the correction unit changes a digital value of a sampling point having a maximum value among the loaded sampling points and a digital value of a sampling point having a second maximum value with a digital value of a sampling point among the plurality of sampling points included in the look-up table storage unit having a maximum value if the target frequency is greater than a predetermined limiting frequency.

6. The apparatus of claim 1, wherein the correction unit changes a digital value of at least one sampling point among the loaded sampling points with a digital value of a sampling point among the plurality of sampling points included in the look-up table storage unit having a minimum value.

7. The apparatus of claim 6, wherein the correction unit changes a digital value of a sampling point having a minimum value among the loaded sampling points with a digital value of a sampling point included in the look-up table storage unit having a minimum value if a sampling point having a minimum value is not loaded by the waveform-synthesizing unit from among the sampling points included in the look-up table storage unit.

8. The apparatus of claim 6, wherein the correction unit changes a digital value of a sampling point having a minimum value among the loaded sampling points and a digital value of a sampling point having a second minimum value with a digital value of a sampling point among the plurality of sampling points included in the look-up table storage unit having a minimum value if the target frequency is greater than a predetermined limiting frequency.

9. The apparatus of claim 1, wherein the correction unit includes:
a frequency comparator configured to compare the target frequency with a predetermined limiting frequency; and
a sampling point corrector configured to substitute a digital value of at least one sampling point among the loaded sampling points according to a result obtained by comparing the target frequency with the limiting frequency.

10. The apparatus of claim 9, wherein the sampling point corrector changes a digital value of a sampling point having a maximum value and a digital value of a sampling point having a second maximum value among the loaded sampling points, with a digital value of a sampling point among the plurality of sampling points included in the look-up table storage unit having a maximum value if the target frequency is greater than the limiting frequency.

11. The apparatus of claim 1, wherein the sinusoidal wave generating unit includes: a digital-to-analog converter configured to convert digital values of a plurality of sampling points changed by the correction unit into analog values; and an amplifier filtering the analog values.

12. The apparatus of claim 11, wherein the digital-to-analog converter is a binary digital-to-analog converter.

13. A system for driving a piezoelectric actuator, comprising:
a piezoelectric actuator operated by receiving sinusoidal waves at both terminals thereof; and
the apparatus for generating sinusoidal waves of claim 1.

14. A method for generating sinusoidal waves, comprising:
receiving a target frequency;
loading at least some of a plurality of sampling points included in a look-up table by using an integer ratio calculated based on the target frequency and a predetermined base frequency;
correcting a digital value of at least one sampling point among the loaded sampling points with a digital value of a sampling point having a maximum value among the plurality of sampling points included in the look-up table; and
generating sinusoidal waves according to the changed sampling points.

15. The method of claim 14, wherein the loading of the plurality of sampling points includes loading every $n^{th}$ sampling point from among the sampling points in the look-up table, where n denotes the integer ratio.

16. The method of claim 14, further comprising:
correcting a digital value of at least one sampling point among the loaded sampling points with a digital value of a sampling point having a minimum value among the sampling points included in the look-up table, prior to the generating of the sinusoidal waves.

17. The method of claim 14, wherein the correcting of the sampling point includes:
comparing the target frequency with a predetermined limiting frequency; and
correcting a digital value of a sampling point having a maximum value and a digital value of a sampling point having a second maximum value among the loaded sampling points, with a digital value of a sampling point having a maximum value among the plurality of sampling points included in the look-up table if the target frequency is greater than the limiting frequency.

18. The method of claim 17, wherein the correcting of the sampling point further includes:
correcting a digital value of a sampling point among the loaded sampling points having a minimum value and a digital value of a sampling point having a second minimum value, with a digital value of a sampling point having a minimum value among the plurality of sampling points included in the look-up table.

* * * * *